(12) United States Patent
Hirahara et al.

(10) Patent No.: US 6,205,368 B1
(45) Date of Patent: Mar. 20, 2001

(54) WORK TRANSPORT CONTROL METHOD

(75) Inventors: Yorio Hirahara, Settsu; Haruo Maetani, Ikoma, both of (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 09/050,450

(22) Filed: Mar. 30, 1998

(30) Foreign Application Priority Data

Mar. 31, 1997 (JP) .................................................. 9-098328
Jan. 23, 1998 (JP) ................................................ 10-026485

(51) Int. Cl.$^7$ ..................................................... G06F 19/00
(52) U.S. Cl. ......................... 700/112; 700/121; 414/935
(58) Field of Search ................................... 700/113, 112, 700/228, 95, 121, 61, 56; 414/744.5, 935, 936

(56) References Cited

U.S. PATENT DOCUMENTS

| | | | |
|---|---|---|---|
| 4,584,045 | * | 4/1986 | Richards ............................... 156/345 |
| 5,083,896 | * | 1/1992 | Uehara et al. ...................... 414/744.5 |
| 5,151,008 | * | 9/1992 | Ishida et al. ....................... 414/744.5 |
| 5,288,379 | * | 2/1994 | Namiki et al. .................. 204/192.12 |
| 5,447,409 | * | 9/1995 | Grunes et al. ..................... 414/744.6 |
| 5,483,138 | * | 1/1996 | Shmookler et al. ............. 318/568.16 |
| 5,584,647 | * | 12/1996 | Uehara et al. ...................... 414/744.5 |
| 5,647,724 | * | 7/1997 | Davis, Jr. et al. ................. 414/744.5 |
| 5,687,085 | * | 11/1997 | Morimoto et al. .................... 700/121 |
| 5,713,717 | * | 2/1998 | Cho .................................... 414/744.5 |
| 5,765,444 | * | 6/1998 | Bacchi et al. ...................... 74/490.03 |
| 5,789,878 | * | 8/1998 | Droeder et al. ......................... 318/45 |
| 5,851,296 | * | 12/1998 | Haraguchi et al. ................... 118/719 |
| 5,943,230 | * | 8/1999 | Rinnen et al. ........................... 700/18 |
| 5,950,495 | * | 9/1999 | Ogawa et al. ...................... 74/490.01 |
| 5,975,740 | * | 11/1999 | Lin et al. ................................. 700/99 |
| 5,975,834 | * | 11/1999 | Ogawa et al. ...................... 414/744.5 |
| 6,099,238 | * | 8/2000 | Tsubota ............................... 414/744.5 |
| 6,102,164 | * | 8/2000 | McClintock et al. ................ 187/267 |

OTHER PUBLICATIONS

Daihen Corporation, Clean Transfer Technology Department, Advanced Component Division (1997). *Instruction Manual (Parrallel Interface) Dual–Arm Wafer Transfer Robot* . . . 1st Edition.

* cited by examiner

*Primary Examiner*—William Grant
*Assistant Examiner*—Edward F. Gain, Jr.
(74) *Attorney, Agent, or Firm*—Scully, Scott, Murphy & Presser (57) ABSTRACT

A method of controlling a transport system for transporting a work from one station to another, which system includes a plurality of stations arranged in a circular row, a transport robot assembly including two manipulator arms, a main controller for controlling the transport system in its entirety relative to the transport robot assembly, and a robot controller for controlling sequential operation of the transport robot assembly. The method is practiced by causing the main controller to transmit to the robot controller a transport command for causing the transport robot assembly to transport the work; in response to the transport command, calculating the direction and angle of swivel required for each of the manipulator arms to angularly move to transport the work from one of the stations towards another one of the stations, in reference to the current position of the respective manipulator arm and the number of such one of the stations; based on a result of the calculation, selecting one of the manipulator arms that may angularly move a minimum angular distance from such one of the stations to such another one of the stations; and causing the robot controller to drive the selected manipulator arm to angularly move in the direction, in which the selected manipulator arm is permitted to travel the minimum angular distance from such one of the stations to such another one of the stations, after the work has been removed from such one of the stations.

1 Claim, 8 Drawing Sheets

WORK TRANSPORT CONTROL METHOD

BACKGROUND OF THE INVENTION

1. Field of the Invention

The present invention generally relates to a method of controlling a transport system and, more particularly, to a method of controlling the transport system including a transport robot or manipulator having two manipulator arms that is generally used in the manufacture of semiconductor devices or liquid crystal displays.

2. Description of the Prior Art

Figure 7:
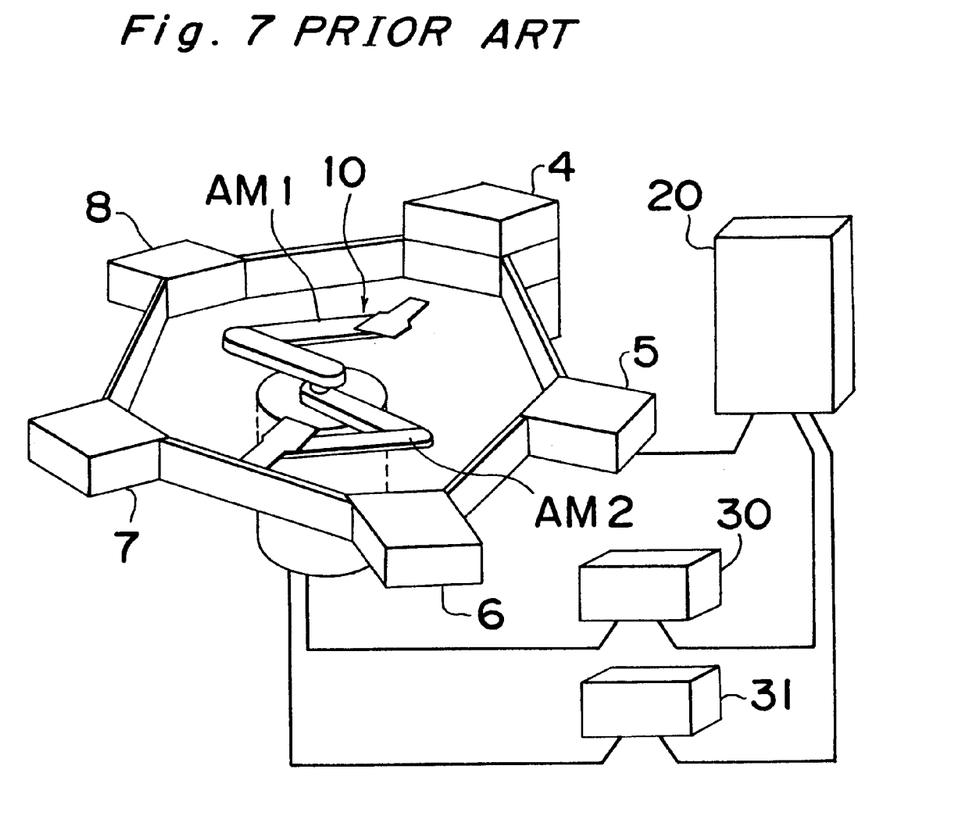
FIG. 7 is a schematic diagram showing the prior art work transport system.

In the transport system used for transporting works such as, for example, semiconductor wafers or liquid crystal substrates, a robot or manipulator having two manipulator arms is generally employed to increase the efficiency of transport of the works. An example of the prior art transport system utilizing the two-arm robot is shown in FIG. 7. Referring to FIG. 7, reference numeral 4 represents a load lock chamber for accommodating a stack of works, and reference numerals 5 to 8 represent processing chambers in which chemical vapor deposition and etching are carried out successively to the works. A transport robot or manipulator 10 is shown as positioned at a center region of the circle having respective portions occupied by the chambers 4 to 8 and includes a first manipulator arm AM1 and a second manipulator arm AM2. This transport robot 10 is controlled by a main controller 20 through first and second robot controllers 30 and 31 for controlling the respective first and second manipulator arms AM1 and AM2.

In the prior art transport system shown in FIG. 7, each work is removed from the load lock chamber 4 through a vacuum-side door and is then transported to any one of the processing chambers 5 to 8. The work which has been subjected to a predetermined process such as, for example, chemical vapor deposition, in the processing chamber is subsequently transported either to the next one of the processing chambers 5 to 8 for subsequent processing or back to the load lock chamber 4.

Figure 8:
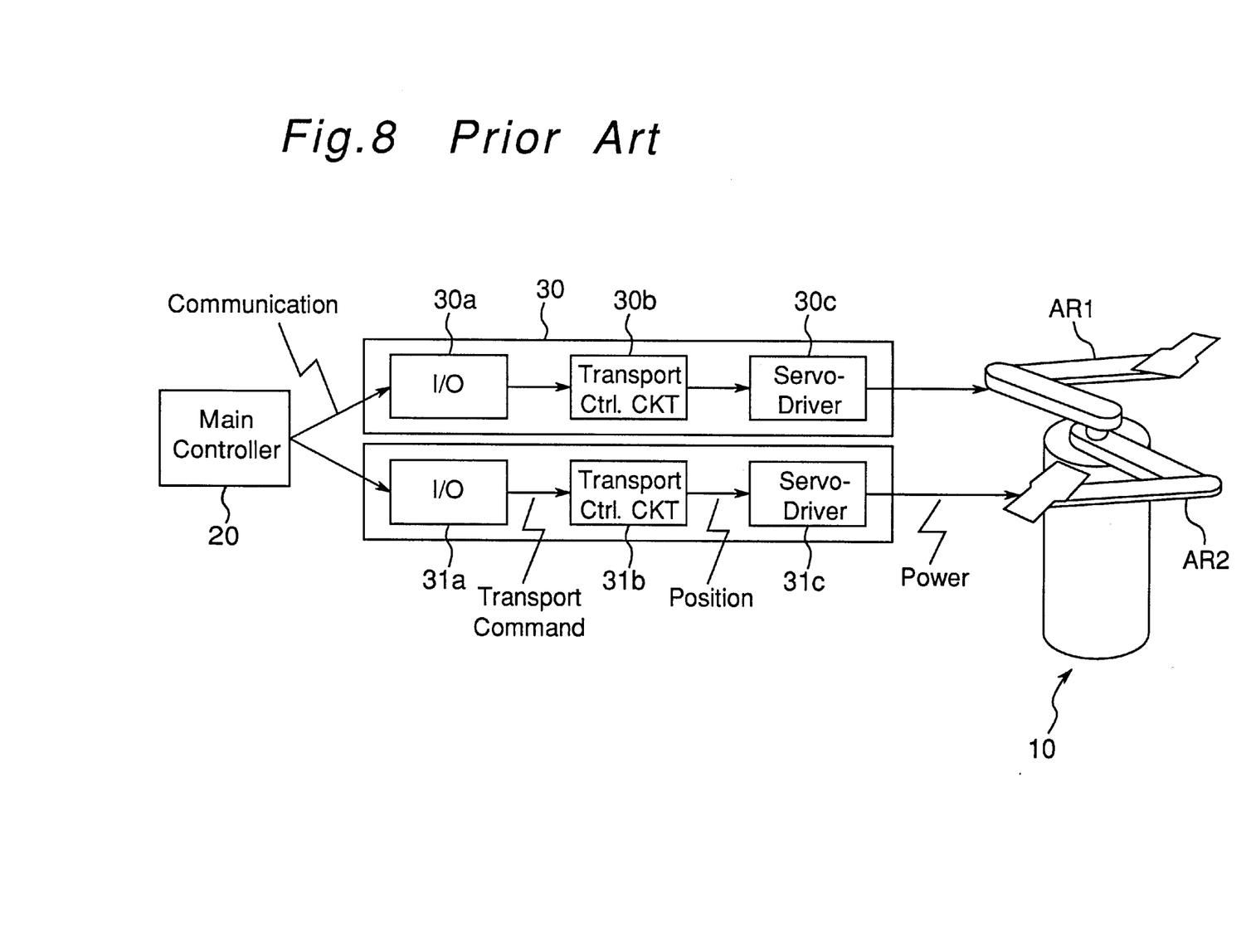
FIG. 8 is a circuit block diagram showing the controllers used in the prior art work transport system.
Figure 9:
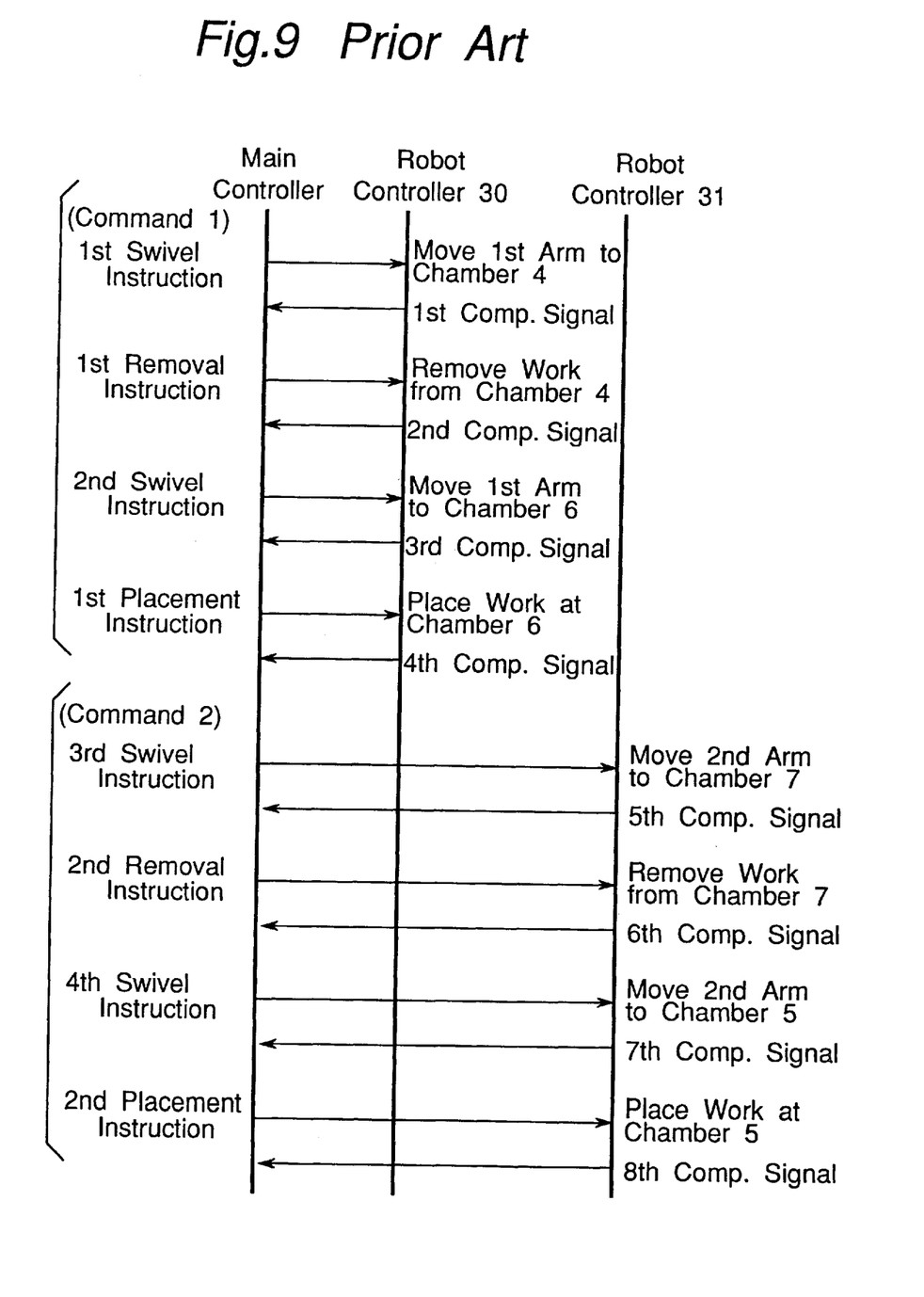
FIG. 9 is a diagram showing the manner in which communications are exchanged among the controllers in the prior art work transport system.

A circuit block diagram of each of the first and second robot controllers 30 and 31 shown in FIG. 7 is shown in FIG. 8, and the manner in which communications are exchanged among the controllers 20, 30 and 31 are diagrammatically shown in FIG. 9. As shown in FIG. 8, each of the first and second robot controllers 30 and 31 includes an input/output (I/O) circuit 30a or 31a for interfacing between the main controller 20 and the respective robot controller 30 or 31, and a transport control circuit 30b and 31b for feeding a servo-driver 30c or 31c with position information required to execute a transport command, said servo-driver 30c or 31c being operable in response to the position information to drive a motor for actuating the associated manipulator arm AM1 or AM2.

Let it be assumed that the transport system shown in FIGS. 7 and 8 is instructed to execute two commands 1 and 2, as shown in FIG. 9, to transport the work in the load lock chamber 4 to the processing chamber 6 and to transport the work in the processing chamber 7 to the processing chamber 5, respectively.

When the command 1 is to be executed, the main controller 20 transmits to the first robot controller 30 a first swivel instruction to swivel the first manipulator arm AM1 to a position aligned with the load lock chamber 4. In response to this first swivel instruction, the first robot controller 30 causes the first manipulator arm AM1 to be swivelled to the position aligned with the load lock chamber 4, followed by generation to the main controller 20 a first completion signal indicative of completion of the swivel of the first manipulator arm AM1 to the position aligned with the load lock chamber 4. After having received the first completion signal, the main controller 20 transmits to the first robot controller 30 a first removal instruction to cause the first manipulator arm AM1 to remove the work from the load lock chamber 4. The first robot controller 30 having received the first removal instruction causes the first manipulator arm AM 1 to remove the work from the load lock chamber 4 and then supplied the main controller 20 with a second completion signal indicative of completion of removal of the work from the load lock chamber 4.

In response to the second completion signal, the main controller 20 transmits to the first robot controller 30 a second swivel instruction to swivel the first manipulator arm AM1 to a position aligned with the processing chamber 6. The first robot controller 30 upon receipt of the second swivel instruction causes the first manipulator arm AM1 to be swivelled to a position aligned with the processing chamber 6 and subsequently supplies the main controller 20 with a third completion signal indicative of completion of swivel of the first manipulator arm AM1 to the position aligned with the processing chamber 6. Generation of this third completion signal from the first robot controller 30 takes place upon completion of swivel of the first manipulator arm AM1 to the position aligned with the processing chamber 6.

Upon receipt of the third completion signal, the main controller 20 supplies the first robot controller 30 with a first placement instruction to set the work carried by the first manipulator arm AM1 to the processing chamber 6. After the work has been set to the processing chamber 6, the first robot controller 30 generates a fourth completion signal to the main controller 20, informing the main controller 20 of completion of placement of the work in the processing chamber 6. In this way, the command 1 is executed completely.

The command 2 is executed in a manner substantially similar to that described above in connection with the command 1 with communications being exchanged between the main controller 20 and the second robot controller 31 as shown in a lower portion of FIG. 9, to thereby complete the required work handling.

As discussed above, in the prior art transport system, the main controller 20 is required to transmit detailed and specific instructions to any one of the first and second robot controllers 30 and 31 and, therefore, communication between the main controller 20 and any one of the first and second robot controller 30 and 31 tends to be complicated and time-consuming.

SUMMARY OF THE INVENTION

In view of the foregoing, the present invention has been devised to substantially eliminate the above discussed problems inherent in the prior art transport system and is intended to provide a method of controlling the transport system wherein the time required to execute a command is advantageously reduced to thereby increase the efficiency of transport of works.

In order to accomplish this object, the present invention provides a method of controlling a transport system for transporting a work from one station to another, which system includes a plurality of stations arranged in a circular row, a transport robot assembly disposed generally coaxially of the circular row of the stations and including two manipulator arms, a main controller for controlling the transport system in its entirety relative to the transport robot assembly, and a robot controller for controlling sequential operation of the transport robot assembly. The transport system control method of the present invention is practiced by causing the main controller to transmit to the robot controller a transport command for causing the transport robot assembly to transport the work, said transport command including only the number of one of the stations from which the work is to be transported and the number of another one of the stations to which the work is to be transported; in response to receipt of the transport command, calculating the direction and angle of swivel require d for each of the manipulator arms to angularly move to remove an d transport the work from said one of the stations towards said another one of the stations, in reference to the current position of the respective manipulator arm and the number of said one of the stations; based on a result of the calculation, selecting one of the manipulator arms that may angularly move a minimum angular distance from said one of the stations to said another one of the stations; and causing the robot controller to drive the selected manipulator arm to angularly move in the direction, in which the selected manipulator arm is permitted to travel the minimum angular distance from said one of the stations to said another one of the stations, after the work has been removed from said one of the stations.

In contrast to the prior art in which complicated communications are exchanged between the main controller and the robot controllers, the present invention requires the main controller to merely transmit to the single robot controller a transport command specifying one of the stations from which the work is to be transported and also specifying another one of the stations to which the work is to be transported, and therefore, required communications can be simplified. Also, while the prior art has required the use of the two robot controllers for controlling the respective manipulator arms, the single robot controller is sufficient in the practice of the present invention and, therefore, the present invention makes it possible to reduce the cost and the space required.

In addition, according to the present invention, when the work is desired to be transported, one of the manipulator arms which is closest to the station from which the work is removed is selected and, therefore, the length of time required to complete the work transport and the tact time of the transport system as a whole can advantageously be reduced.

BRIEF DESCRIPTION OF THE DRAWINGS

The present invention will become readily understood from the following description of a preferred embodiment thereof made with reference to the accompanying drawings, in which like parts are designated by like reference numeral and in which.

DETAILED DESCRIPTION OF THE EMBODIMENT

Figure 1:
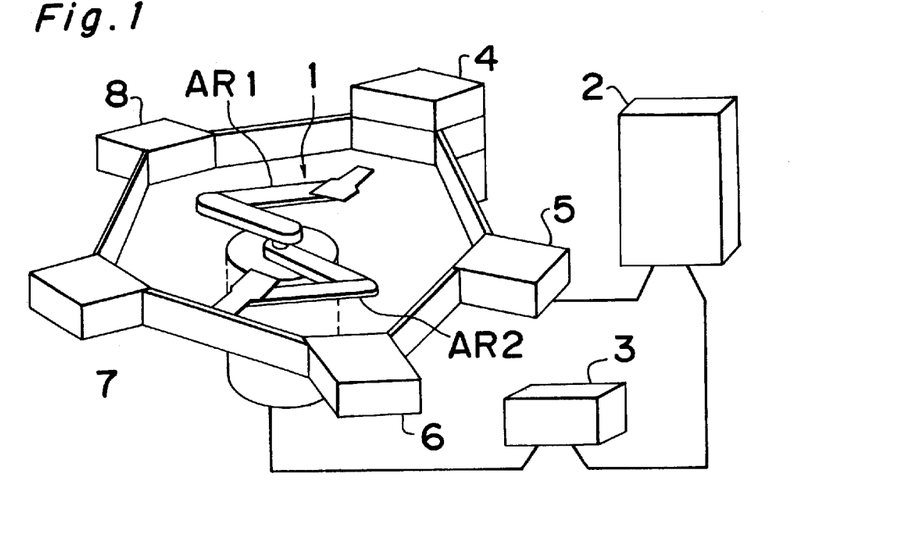
FIG. 1 is a schematic diagram showing a work transport system in which the present invention is embodied.

Referring first to FIG. 1, a transport robot or manipulator employed in the present invention is generally identified by 1 and includes first and second manipulator arms AR1 and AR2. As is the case with the prior art work transport system shown in FIG. 7, the transport robot 1 is positioned at a center region of and generally coaxially of the circle having portions defining stations that are respectively occupied by the processing chambers 4 to 8. The work transport system shown therein includes a main controller 2 and a robot controller 3 for controlling the transport robot 1 as will be described later.

Figure 2:
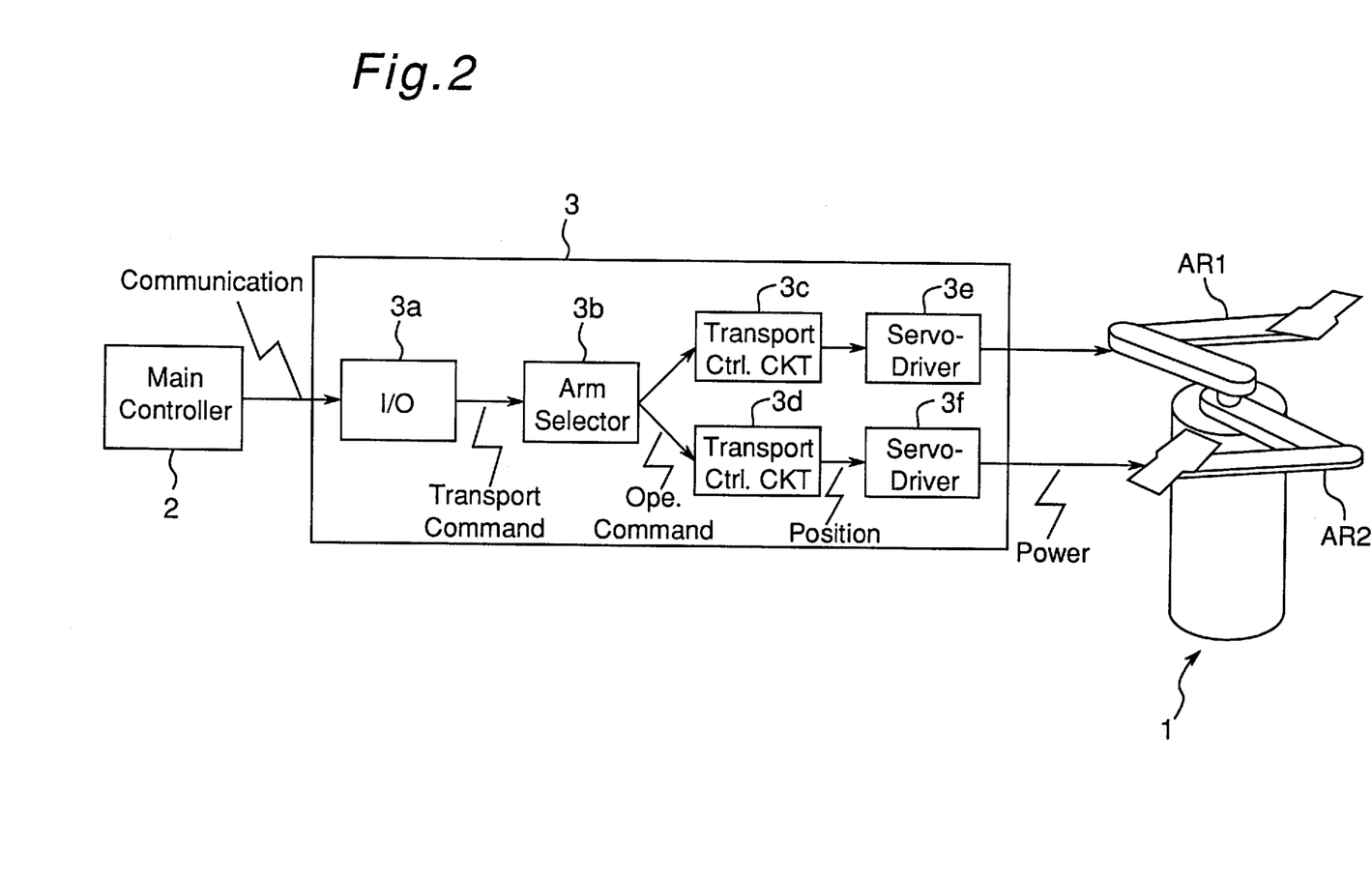
FIG. 2 is a circuit block diagram showing a control system for the work transport system shown in FIG. 1.

As shown in FIG. 2, the robot controller 3 includes an I/O input/output) circuit 3a for interfacing between the main controller 2 and the Robot controller 3, an arm selector circuit 3b, first and second transport control circuits 3c and 3d each operable to feed the subsequent stage, that is, a servo-driver 3e or 3f with position information required to execute a transport command, said servo-driver 3e or 3f being operable in response to the position information to drive a motor for actuating the associated manipulator arm AR1 or AR2.

Figure 3:
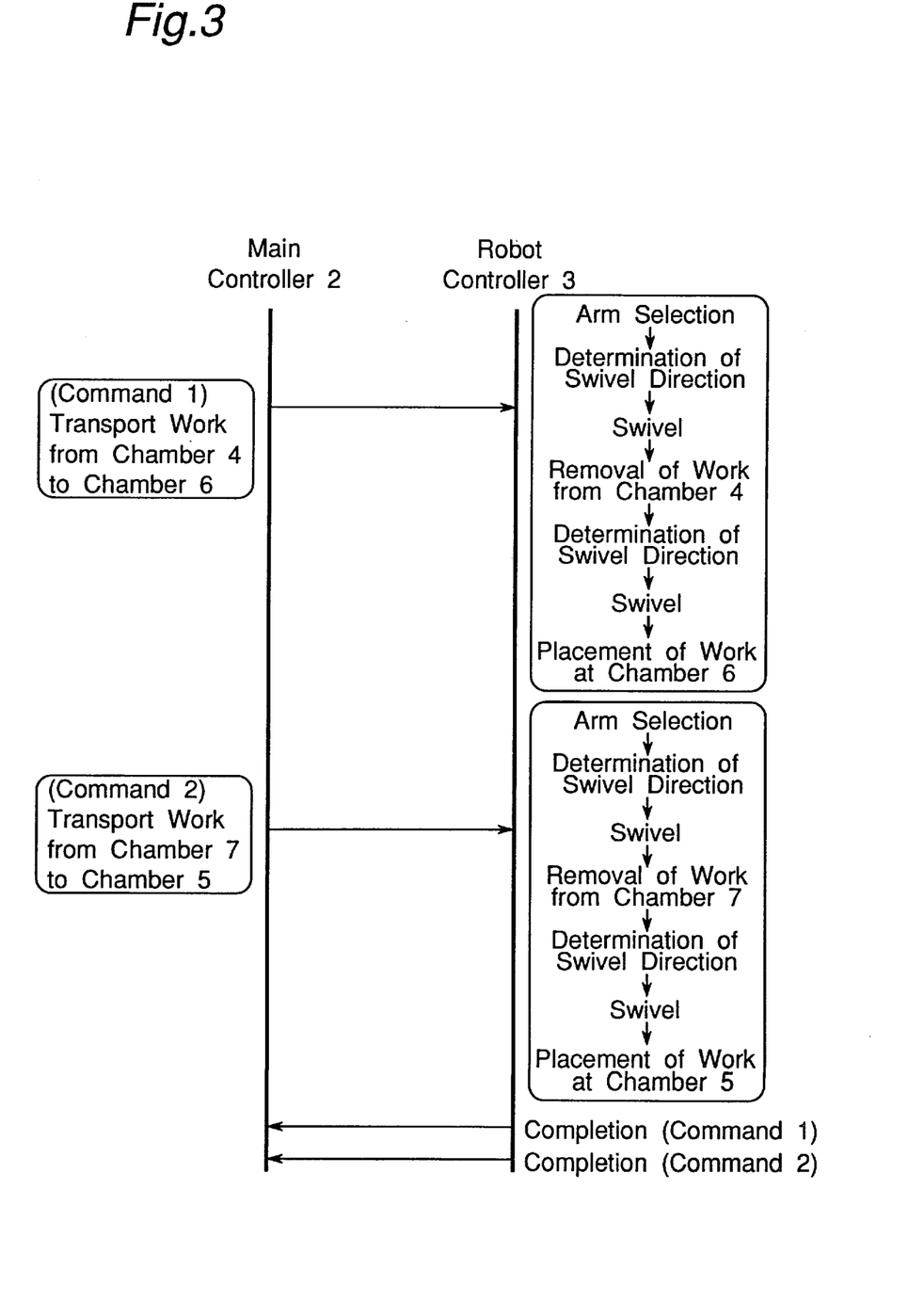
FIG. 3 is a diagram showing the manner in which communications are exchanged among controllers employed in the work transport system of the present invention.

Referring particularly to FIGS. 2 and 3, when the main controller 2 transmits to the robot controller 3 a command specifying one of the chambers 4 to 8 from which a work is to be removed and also specifying the destination to which the work so removed is to be placed, this command is supplied through the I/O circuit 3a to the arm selector circuit 3b which, in response to the command, selects one of the first and second manipulator arms AR1 and AR2. Utilizing the selected manipulator arm, the direction of swivel in which the selected manipulator arm can swivel a minimum distance towards one of the chambers from which the work is to be removed is determined so that the selected manipulator arm can swivel towards such one of the chambers to remove the work therefrom, and the direction of swivel in which the selected manipulator arm can swivel a minimum distance towards the destination is determined so that the selected manipulator arm can swivel towards the destination to set the work at the destination.

The manner in which the transport robot 1 transports the work will now be described with particular reference to FIGS. 4 to 6.

Figure 4:
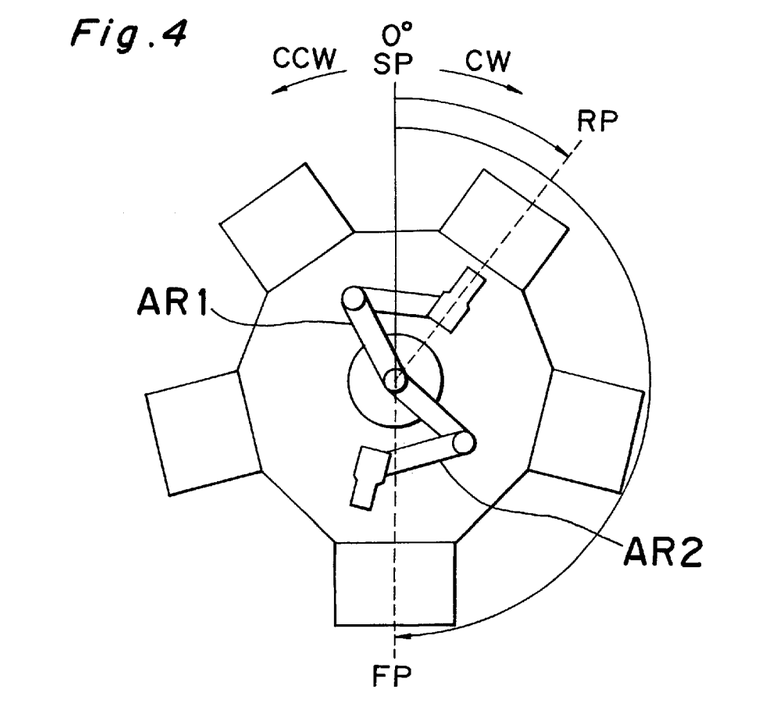
FIG. 4 is a schematic top plan view of a two-arm robot, showing directions of swivel of arms and also positions of component parts of the work transport system of FIG. 1.

FIG. 4 illustrates directions of swivel of the manipulator arms and also positions where the component parts of the work transport system are arranged. In this figure, reference character CW represents a clockwise direction, reference character CCW represents a counterclockwise direction and reference character SP represents a reference position of the transport robot 1. The various stations are defined at respective positions spaced varying angles from the reference position SP of the transport robot 1 in the clockwise direction CW.

Let it be assumed that the current position of the manipulator arm is spaced an angle RP from the reference position SP of the transport robot 1 in the clockwise direction CW and that one of the stations from which the work (which is hereinafter referred to as a source station) is to be transported which is specified by the main controller 2 is spaced an angle FP from the reference position SP of the transport robot 1 in the clockwise direction CW. Then, it will readily be see that the amount of swivel of the manipulator arm from the current position to such source station in the clockwise direction CW will be an angle $CW_{13}$ M which can be calculated from the following equation:

$$CW\_M=FP-RP \tag{1}$$

However, when it happens that CW_M<0, the angle of the resultant difference plus 360° results in CW_M.

Similarly, the amount of swivel of the manipulator arm from the current position in the counterclockwise direction will be an angle CCW_M which can be calculated from the following equation:

$$CCW\_M=RP-FP \tag{2}$$

However, when it happens that CCW_M <0, the angle of the resultant difference plus 360° results in CCW_M.

Based on the respective results of calculation of the equations (1) and (2), one of the manipulator arms that can angularly move a minimum swivel amount from the current position towards the source station is selected. Where, however, both of the manipulator arms can angularly move an equal swivel amount from the current position towards the source station, one of the manipulator arms to move in preference to the other thereof is preselected.

Figure 5:
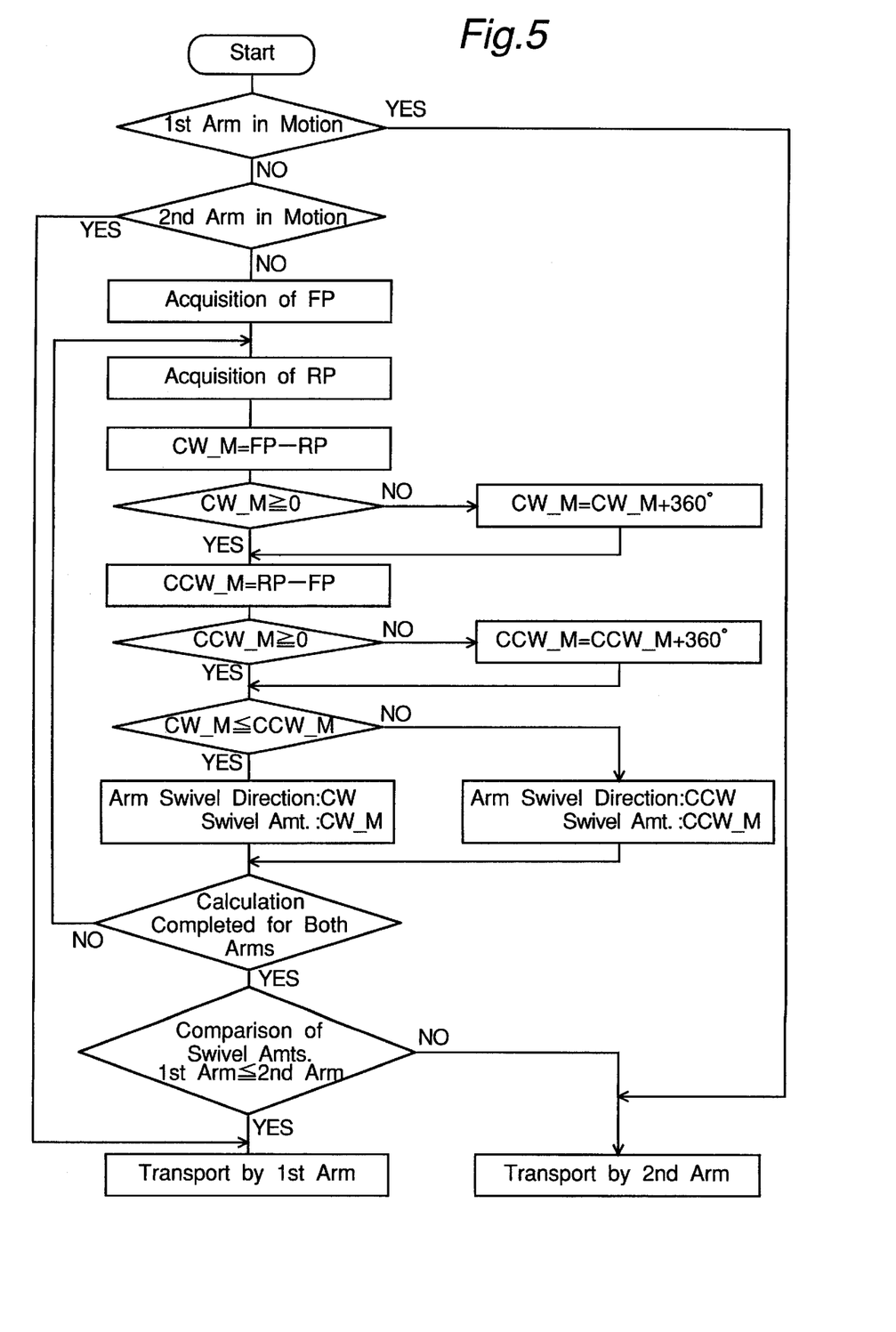
FIG. 5 is a flowchart showing the sequence of operation performed by an arm selector circuit shown in FIG. 2.

FIG. 5 illustrates the sequence of operation of the arm selector circuit 3b shown in FIG. 2. In FIG. 5, it is predetermined that where the amount of swivel in the clockwise direction CW and that in the counterclockwise direction CCW are the same, the clockwise direction CW can be selected, but where the amount of swivel of the first manipulator arm AR1 from the current position to the source station and that of the second manipulator arm AR2 from the current position to the source station are equal to each other, the first manipulator arm AR1 can be selected.

By way of example, assuming that the current position RP1 of the first manipulator arm AR1 is spaced 80°, the current position RP2 of the second manipulator arm AR2 is spaced 300°, and the source station FP is spaced 200°, CW_M1 and CCW_M1 of the first manipulator arm AR1 can be calculated as follows:

$$CW\_M1=FR-RP1=200°-80°=120°$$

$$CCW\_M1=RP1-FP=80°-200°=-120°$$

Since CCW_M1<0, when 360° is added thereto:

$$CCW\_M1=-120°+360°=240°$$

Considering that CWM1<CCWM1, the amount of swivel of the first manipulator arm AR1 is 120° in the clockwise direction, that is, the direction that requires for the first manipulator arm AR1 to swivel the minimum angle.

On the other hand, the direction in which the second manipulator arm AR2 is required to swivel the minimum angle will be determined as follows:

$$CW\_M2=FR-RP2=200°300°=-100°$$

$$CCW\_M2=RP2-FP=300°-200°=100°$$

Since CCW_M2>CCW_M2, the second manipulator arm AR2 has to swivel 100° in the counterclockwise direction, that is, the direction that requires for the second manipulator arm AR2 to swivel the minimum angle. Comparing the amount of swivel the first manipulator arm AR1 has to undergo with the amount of swivel the second manipulator arm AR2 has to undergo, the latter is smaller than the former and, therefore, the second manipulator arm AR2 is selected.

Figure 6:
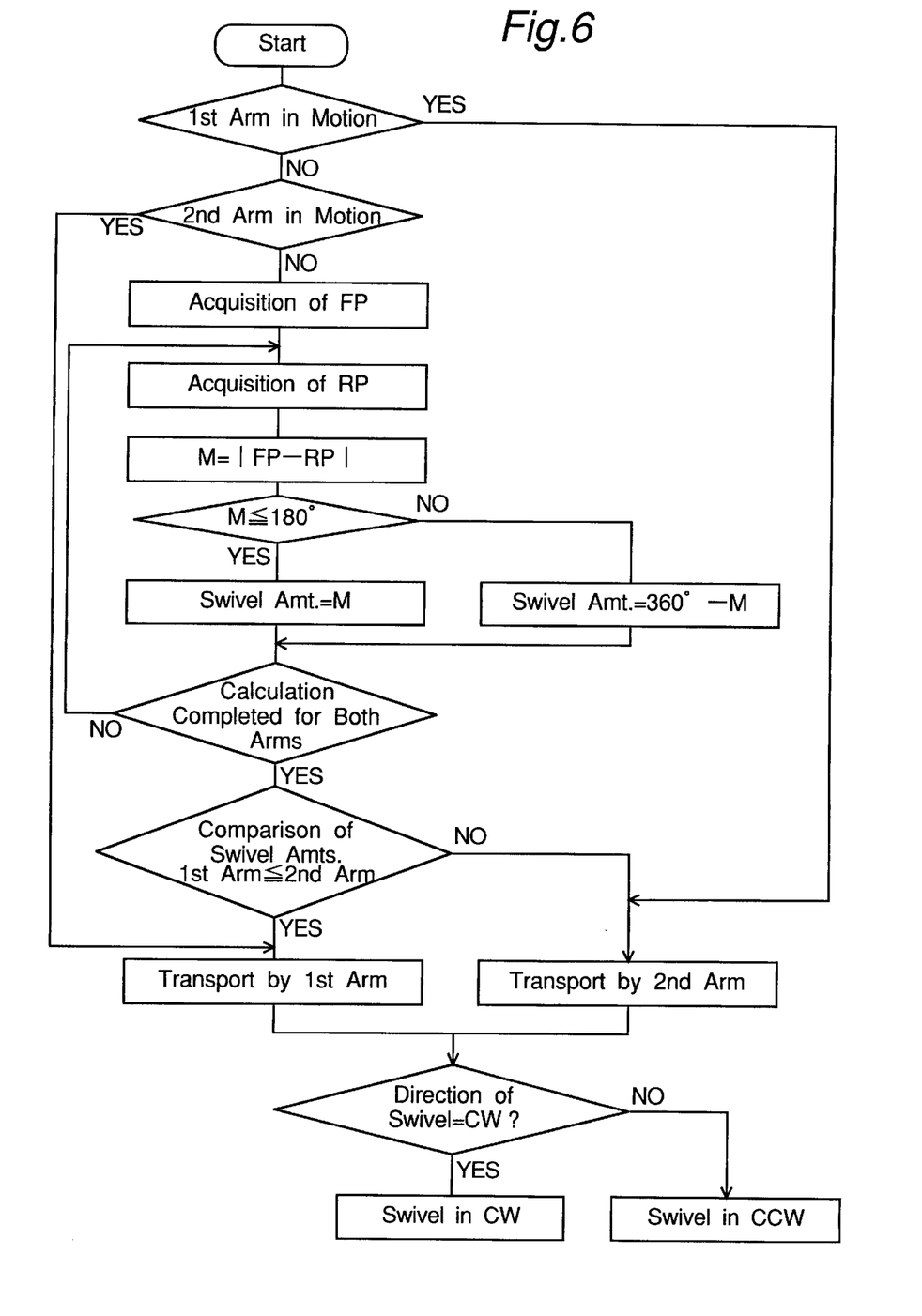
FIG. 6 is a flowchart showing the modified sequence of operation performed by the arm selector circuit shown in FIG. 2.

FIG. 6 illustrates a modified flowchart showing the sequence of operation of the arm selector circuit 3b. In describing the sequence of operation of the arm selector circuit 3b according to the modified flowchart, the respective current positions RP1 and RP2 of the first and second manipulator arms AR1 and AR2 and the source station FP are assumed to be spaced under the same conditions as in FIG. 5, that is, spaced 80°, 300° and 200°, respectively.

In the first place, the amount of swivel M1 of the first manipulator arm AR1 is determined as follows:

$$M1=|FP-RP1|=|200°-80°|=120°$$

Since $M1 \leq 180°$, the amount of swivel M1 of the first manipulator arm AR1 is 120°.

Then, the amount of swivel M2 of the second manipulator arm AR2 is determined as follows:

$$M2=|FP-RP2|=|200°-300°|=100°$$

Since $M2 \leq 180°$, the amount of swivel M2 of the second manipulator arm AR2 is 100°.

Comparing the amount of swivel M1 of the first manipulator arm AR1 with the amount of swivel M2 of the second manipulator arm AR2, $M1 \geq M2$ and, hence, the second manipulator arm AR2 that has to swivel the smaller amount of swivel than the first manipulator arm AR1 is selected.

The direction in which the selected second manipulator arm AR 2 has to swivel is then determined as follows: Where the amount of swivel M2 is $M2=|FP-RP2| \leq 180°$, the clockwise direction is chosen if $FP-RP2 \geq 0$, but the counterclockwise direction is chosen if FP-RP2<0.

On the other hand, where the amount of swivel M is M=|FP-RP|>180°, the clockwise direction is chosen if FP-RP<0, but the counterclockwise direction is chosen if $FP-RP \geq 0$.

Once the amount of swivel of the manipulator arm and the direction in which it has to swivel are determined, the selected manipulator arm can swivel to the source station to remove the work and, once the direction that requires for the selected manipulator arm to swivel the minimum amount of swivel from the source station to the destination is determined in a manner similar to that described above, the work can be transported to the destination for delivery thereto.

Although the present invention has been described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A method of controlling a transport system for transporting a work from one station to another, said transport system comprising a plurality of stations arranged in a substantially circular row, a transport robot assembly disposed generally coaxially of the circular row of the stations and including two manipulator arms, a main controller for controlling the transport system in its entirety relative to the transport robot assembly, and a robot controller for controlling sequential operation of the transport robot assembly, said method comprising the steps of:

a) transmitting from the main controller to the robot controller a transport command for causing the robot assembly to transport the work, said transport command including the number of one of the stations from which the work is to be transported and the number of another one of the stations to which the work is to be transported;

b) prior to the work being picked-up, calculating angles of swivel of each of the manipulator arms in first and second directions opposite to each other about the robot assembly, said angle of swivel being required for each manipulator arm to swivel from a current position to said one of the stations from which the work is transported;

c) selecting one of the manipulator arms and one of the first and second directions for which the angle of swivel that has been calculated is minimum;

d) driving the selected manipulator arm in the selected direction an angular distance corresponding to the calculated minimum angle of swivel to cause the selected manipulator arm to assume said one of the stations;

e) subsequent to the work having been picked-up from said one of the stations, calculating the angle of swivel in each of the first and second directions required during transport of the work from said one of the stations to said another one of the stations;

f) selecting the direction of swivel which is assumed during transport of the work, for which the required angle of swivel attains a minimum value during the transport of the work; and g) driving the selected manipulator arm in the selected direction an angular distance corresponding to the calculated minimum required angle of swivel for the transport of the work; wherein all of said method steps are borne by the robot controller.

* * * * *